US011678038B2

(12) United States Patent
Sakamoto et al.

(10) Patent No.: US 11,678,038 B2
(45) Date of Patent: Jun. 13, 2023

(54) PARTS FOR IMAGING APPARATUS AND IMAGING APPARATUS

(71) Applicant: IRISO ELECTRONICS CO., LTD., Kanagawa (JP)

(72) Inventors: Tetsuma Sakamoto, Kanagawa (JP); Junya Sakaue, Kanagawa (JP); Takashi Sekine, Kanagawa (JP)

(73) Assignee: IRISO ELECTRONICS CO., LTD., Kanagawa (JP)

( * ) Notice: Subject to any disclaimer, the term of this patent is extended or adjusted under 35 U.S.C. 154(b) by 53 days.

(21) Appl. No.: 17/520,954

(22) Filed: Nov. 8, 2021

(65) Prior Publication Data

US 2022/0078320 A1 Mar. 10, 2022

Related U.S. Application Data

(60) Continuation of application No. 16/595,824, filed on Oct. 8, 2019, now Pat. No. 11,196,903, which is a division of application No. 16/075,289, filed as application No. PCT/JP2016/083833 on Nov. 15, 2016, now abandoned.

(30) Foreign Application Priority Data

Feb. 5, 2016 (JP) ................................ 2016-021157

(51) Int. Cl.
*H04N 23/52* (2023.01)
*G03B 17/02* (2021.01)
(Continued)

(52) U.S. Cl.
CPC ............... *H04N 23/52* (2023.01); *G02B 7/02* (2013.01); *G03B 15/00* (2013.01); *G03B 17/02* (2013.01);
(Continued)

(58) Field of Classification Search
CPC .. B60R 11/04; H04N 5/2252; H04N 5/22521; H05K 9/0081
See application file for complete search history.

(56) References Cited

U.S. PATENT DOCUMENTS 8,482,664 B2 7/2013 Byrne
2007/0097518 A1 5/2007 Sanou et al.
(Continued)

FOREIGN PATENT DOCUMENTS

CN 1955833 A 5/2007
CN 102162977 A 8/2011
(Continued)

OTHER PUBLICATIONS

International Search Report (PCT/ISA/210) dated Feb. 21, 2017, by the Japanese Patent Office as the International Searching Authority for International Application No. PCT/JP2016/083833.
(Continued)

*Primary Examiner* — Noam Reisner
(74) *Attorney, Agent, or Firm* — Cermak Nakajima & McGowan LLP; Tomoko Nakajima

(57) ABSTRACT

An imaging apparatus' parts are provided with an outer frame member, an enclosure section shielding body accommodated by the outer frame member and accommodating and achieving electrically continuous connection with an imaging part, a connection that connects a metal shield of a relay connector to the imaging apparatus by contacting with an interior of the enclosure section shielding body, a barrier wall between the relay connector and the enclosure section shielding body, and a connector terminal. The connector terminal includes an internal contact section exposed to an interior of the enclosure section shielding body, and an external contact section exposed to an interior of the connector. The enclosure section shielding body is formed of a box-shaped metal shell accommodating the internal contact
(Continued)

section in the interior. The connector has a connector section shielding body formed of a tubular metal shell accommodating the external contact section in the interior.

12 Claims, 10 Drawing Sheets

(51) Int. Cl.
*H05K 9/00* (2006.01)
*H04N 23/51* (2023.01)
*H05K 7/20* (2006.01)
*G03B 15/00* (2021.01)
*H04N 23/00* (2023.01)
*G02B 7/02* (2021.01)

(52) U.S. Cl.
CPC ............ *H04N 23/00* (2023.01); *H04N 23/51* (2023.01); *H05K 7/20* (2013.01); *H05K 9/00* (2013.01); *H05K 9/0081* (2013.01); *H05K 9/0084* (2013.01)

(56) References Cited

U.S. PATENT DOCUMENTS

| | | | |
|---|---|---|---|
| 2011/0025850 A1* | 2/2011 | Maekawa | H04N 7/102 348/148 |
| 2011/0199485 A1 | 8/2011 | Nakamura | |
| 2011/0249120 A1 | 10/2011 | Bingle et al. | |
| 2011/0279675 A1 | 11/2011 | Mano et al. | |
| 2013/0265427 A1 | 10/2013 | Lin et al. | |
| 2015/0280373 A1 | 10/2015 | Furukawa | |
| 2015/0327377 A1 | 11/2015 | Mano et al. | |
| 2017/0129418 A1 | 5/2017 | Koshiba et al. | |
| 2019/0068860 A1 | 2/2019 | Sakamoto et al. | |

FOREIGN PATENT DOCUMENTS

| | | |
|---|---|---|
| CN | 105100561 A | 11/2015 |
| CN | 105306795 A | 2/2016 |
| EP | 0541449 A2 | 5/1993 |
| EP | 2393277 A1 | 7/2011 |
| JP | 2001-015219 A | 1/2001 |
| JP | 2007-001334 A | 1/2007 |
| JP | 2007-022364 A | 2/2007 |
| JP | 2013-109188 A | 6/2013 |
| WO | WO2015/198598 A1 | 12/2015 |

OTHER PUBLICATIONS

Written Opinion (PCT/ISA/237) dated Feb. 21, 2017, by the Japanese Patent Office as the International Searching Authority for International Application No. PCT/JP2016/083833.
Extended European Search Report dated May 27, 2019 in corresponding European Application No. 16889377.4.
Office Action from Chinese Patent App. No. 201680080988.4 (dated Jun. 1, 2020).

* cited by examiner

PARTS FOR IMAGING APPARATUS AND IMAGING APPARATUS

This application is a Continuation under 35 U.S.C. § 120 of U.S. patent application Ser. No. 16/595,824, filed Oct. 8, 2019, which was a Divisional application under 37 C.F.R. § 120 of U.S. patent application Ser. No. 16/075,289, filed Aug. 3, 2018, which was a national phase entry under 35 U.S.C. § 371 of PCT Patent Application No. PCT/JP2016/083833, filed Nov. 15, 2016, which claims priority under 35 U.S.C. § 119 to Japanese Patent Application No. 2016-021157, filed Feb. 5, 2016, the entireties of which are incorporated by reference.

TECHNICAL FIELD

The present invention relates to an imaging apparatus, and particularly to an imaging apparatus, such as an in-vehicle camera.

BACKGROUND ART

A compact imaging apparatus including a built-in imaging element is used, such as an in-vehicle drive recorder, an in-vehicle camera used to improve visibility of the rear side of the vehicle, and a surveillance camera used for crime prevention in a bank, a shop, and other locations. An example of the imaging apparatus of related art is described, for example, in Japanese Patent Laid-open No. 2007-1334 (Patent Literature 1).

The in-vehicle camera 1 (imaging apparatus) described in Patent Literature 1 includes a rear enclosure 9 formed of a resin molded body that forms a camera enclosure that accommodates electronic parts, and a tubular connector section 11 for external connection is formed in the rear enclosure 9. The camera enclosure accommodates pin-shaped connector terminals 11b, which each have one end that protrudes into the rear enclosure 9 and connects the electronic parts in the rear enclosure 9 to the connector section 11 and the other end that protrudes into the connector section 11 and achieves electrically continuous connection with a counter connector 100 of a vehicle-side harness 101.

CITATION LIST

Patent Literature

Patent Literature 1: Japanese Patent Laid-open No. 2007-1334, FIG. 2

SUMMARY OF INVENTION

Technical Problem

Such an imaging apparatus is required, as the performance thereof advances, to include a housing (camera enclosure) resistant to electromagnetic noise that externally enters the imaging apparatus. To meet the requirement, it is conceivable to replace the housing formed of a hard resin molded body with an aluminum diecast housing. A diecast housing, however, has not only a problem of an increase in weight but a problem of an increase in manufacturing cost. As another method for meeting the requirement, it is conceivable to form the rear enclosure 9 and the connector section 11 integrally with each other by drawing a metal thin plate in press working into a single drawn body. The connector section 11 has, however, a tubular shape thinner than the rear enclosure 9. It is extremely difficult to manufacture the thin connector section 11 integrally with the rear enclosure 9, which is larger than the connector section 11, in a drawing process. Further, a drawing die is complicated, and the manufacturing cost thereof is therefore high. The method described above cannot be a realistic solution appropriate for volume production.

The present invention has been made based on the related art described above. An object of the present invention is to provide an imaging apparatus that is resistant to electromagnetic noise and can be readily manufactured at low cost.

Solution to Problem

To achieve the object described above, the present invention has the following features:

The present invention relates to parts for an imaging apparatus comprising an outer frame member made of a resin including an enclosure section that accommodates an imaging part, a connector section that connects an external conductor to the imaging apparatus, and a barrier wall between the enclosure section and the connector section and a connector terminal including an internal contact section exposed to an interior of the enclosure section and an external contact section exposed to an interior of the connector section, the parts for an imaging apparatus are characterized in that the parts for an imaging apparatus further comprises an enclosure section shielding body formed of a box-shaped metal shell that accommodates the internal contact section in the interior of the enclosure section and a connector section shielding body formed of a tubular metal shell that accommodates the external contact section in the interior of the connector section.

According to the present invention, the enclosure section shielding body, which is a box-shaped metal shell, can suppress influence of electromagnetic noise on the internal contact section of the connector terminal in the enclosure section. Further, the connector section shielding body, which is a tubular metal shell, can suppress influence of electromagnetic noise on the external contact section of the connector terminal in the connector section which connects the external conductor to the imaging apparatus. A bad influence of the external electromagnetic noise on the connector terminal, which serves as an electrically continuous path, can therefore be avoided. In particular, parts for an imaging apparatus suitable for transmission of a high-frequency signal can be achieved. Further, the enclosure section shielding body, which is a box-shaped metal shell, and the connector section shielding body, which is a tubular metal shell, are components separate from each other and can therefore each be relatively readily manufactured as a press-worked metal thin plate.

The connector section shielding body may include a contact piece that achieves electrically continuous connection with the enclosure section shielding body. The connector section shielding body and the enclosure section shielding body can therefore achieve electrically continuous connection with each other via the contact piece, whereby the achieved electrically continuous path can be used, for example, to ground the imaging part accommodated in the enclosure section. Further, a heat dissipation path can be so formed as to include the enclosure section shielding body, which accommodates the heat-generating imaging part, and the connector section shielding body connected to each other via the contact piece, whereby heat of the enclosure section shielding body can be dissipated with increased efficiency.

The contact piece may be a spring piece that achieves pressing contact with the enclosure section shielding body. The contact piece, which is formed of a spring piece, therefore achieves pressing contact with the enclosure section shielding body with the aid of the resilient force produced by the spring piece. Therefore, even if the enclosure section shielding body and the connector section shielding body are each positionally shifted and attached, the contact piece formed of a spring piece can absorb the positional shift to achieve pressing contact with the enclosure section shielding body. Further, no soldering step or any other step is required to achieve the electrically continuous connection between the contact piece and the enclosure section shielding body, whereby reliable electrically continuous connection can be achieved by attaching the enclosure section shielding body and the connector section shielding body to a housing.

The enclosure section shielding body may include a circumferential wall section disposed on an inner circumferential surface of a tubular circumferential wall that forms the enclosure section and a bottom wall section disposed on a wall surface that forms the barrier wall and faces the enclosure section. The circumferential wall section and the bottom wall section of the enclosure section shielding body can therefore reliably shield the internal space formed by the enclosure section and the barrier wall against electromagnetic waves.

The connector section shielding body may include a tubular main body that passes through the barrier wall from the interior of the connector section and protrudes into the interior of the enclosure section shielding body. The thus configured tubular main body can reliably and seamlessly shield the electrically continuous path of the connector terminal from the interior of the connector section though the barrier wall to the interior of the enclosure section shielding body.

The connector section shielding body may accommodate the connector terminal and a terminal holder that is made of a resin material and holds the connector terminal. Since an in-shield connector section including the connector terminal described above and the terminal holder that holds the connector terminal is provided in the connector section shielding body, the connector section shielding body can reliably shield the connecter terminal, which forms the electrically continuous path. Further, providing the in-shield connector section in the connector section shielding body allows the in-shield connector section and the connector section shielding body to be handled as an integrated component, that is, a part, whereby the two components can be readily handled in the steps of manufacturing the imaging apparatus.

The connector section shielding body may include a locking section that protrudes from an outer surface of the connector section shielding body and is locked by the outer frame member. The locking section of the connector section shielding body can therefore maintain the correct state in which the connector section shielding body is attached to the outer frame member.

The present invention further provides an imaging apparatus including any of the parts for an imaging apparatus described above. The enclosure section shielding body, which is formed of a box-shaped metal shell, and the connector section shield body, which is formed of a tubular metal shell, can therefore achieve reliable electromagnetic shielding that allows even high-frequency signal transmission via the connector terminal, which is the path along to which an electric signal from the imaging part is transmitted.

The enclosure section shielding body and the connector section shielding body are members separate from each other and can therefore be readily manufactured at low cost, and the outer frame member is made of a resin, whereby an imaging apparatus much lighter than an imaging apparatus including a diecast outer frame member can be provided.

Advantageous Effects of Invention

According to the present invention, the enclosure section shielding body, which is formed of a box-shaped metal shell, and the connector section shield body, which is formed of a tubular metal shell, can achieve reliable electromagnetic shielding that allows even high-frequency signal transmission via the connector terminal, which is the path along to which an electric signal from the imaging part is transmitted, and the two shielding bodies are members separate from each other, whereby an imaging apparatus that can be readily manufactured at low cost can be provided. Further, since the outer frame member is made of a resin, an imaging apparatus much lighter than an imaging apparatus including a diecast outer frame member can be provided. The present invention can therefore contribute to popularization and expansion of a high-performance imaging apparatus.

DESCRIPTION OF EMBODIMENTS

Figure 1:
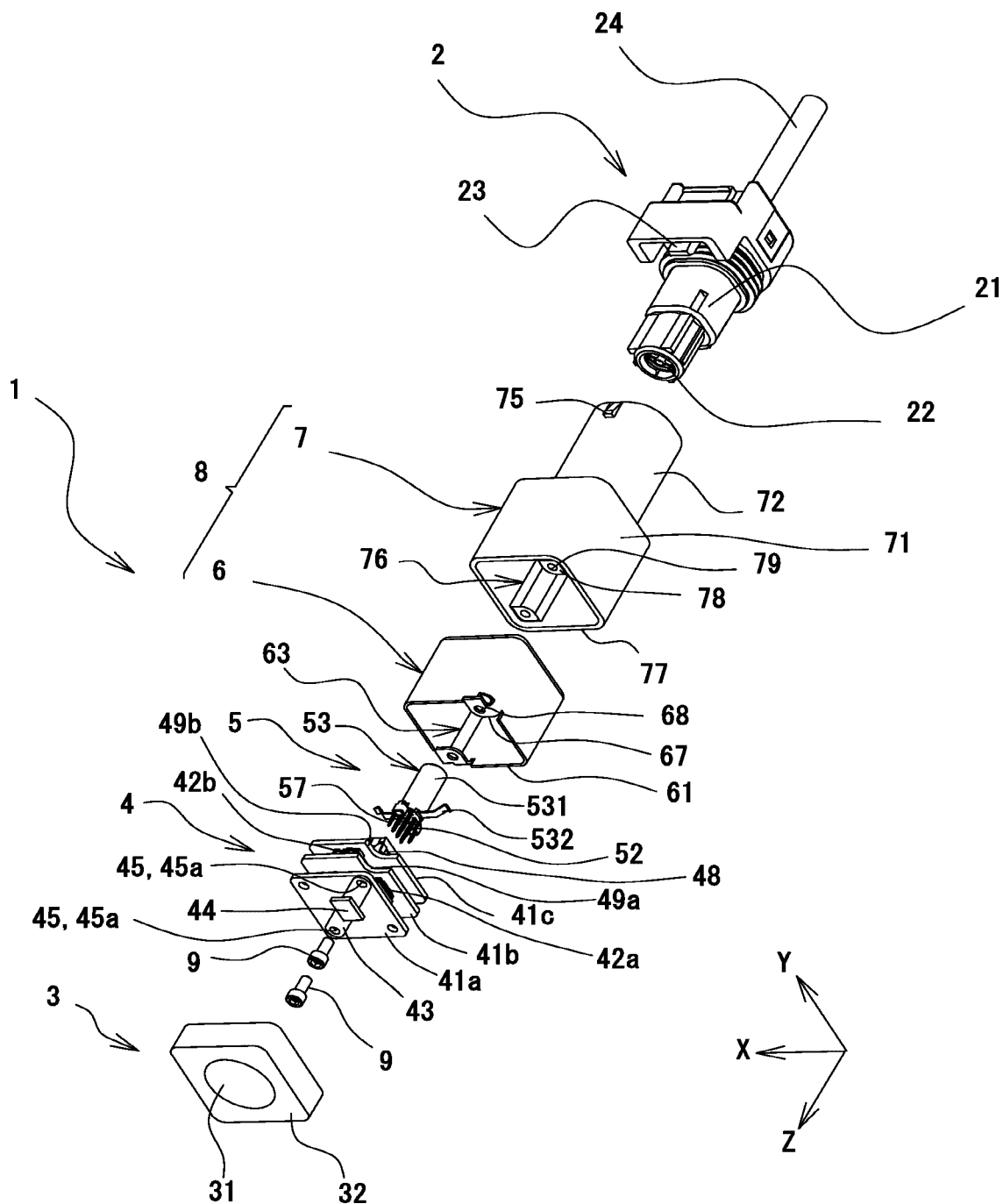
FIG. 1 is an exploded perspective view of an imaging apparatus according to an embodiment of the present invention.
Figure 2:
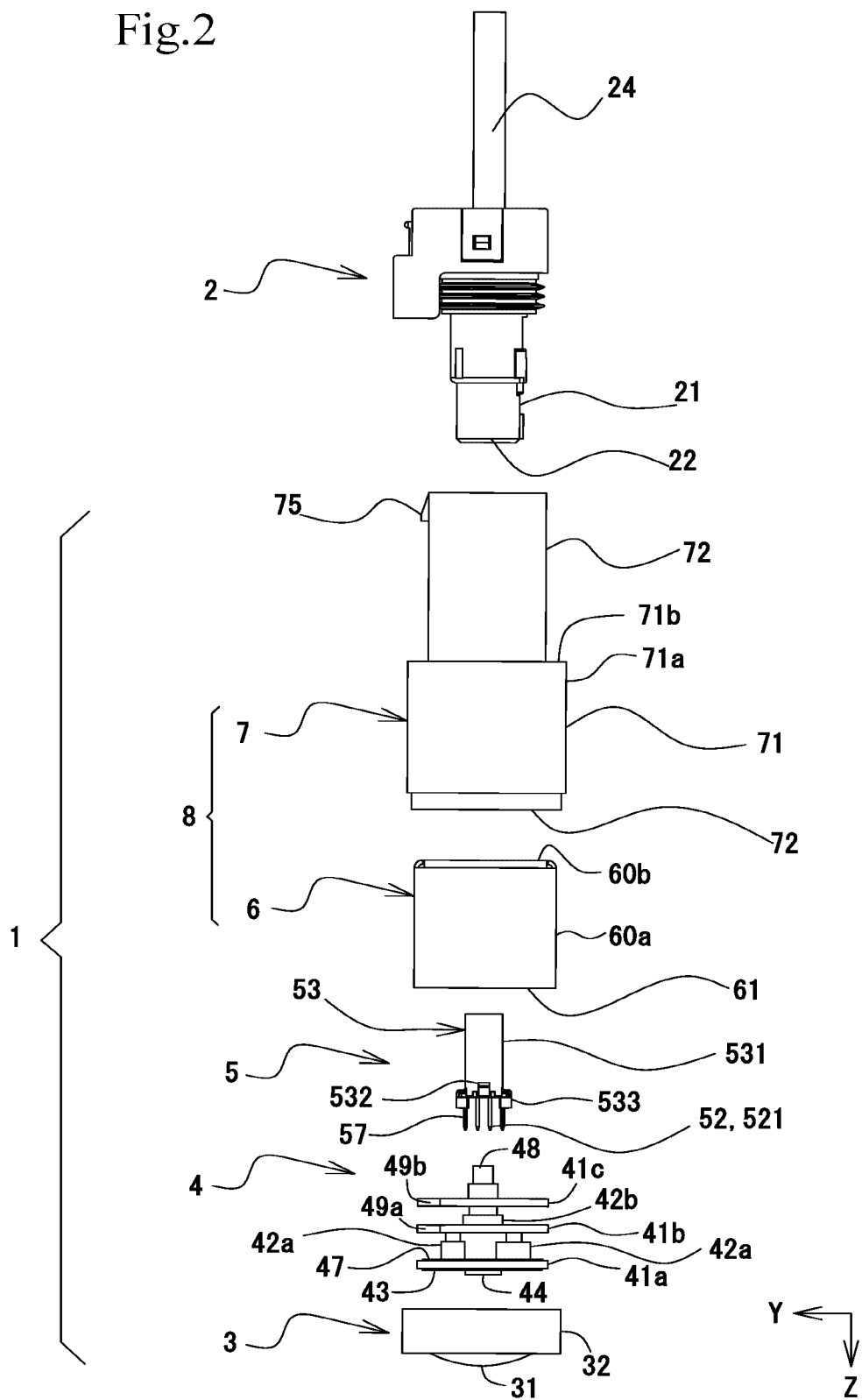
FIG. 2 is an exploded view of the imaging apparatus viewed in the direction X in FIG. 1.

An embodiment of the present invention will be described below with reference to drawings. In the present specification, the claims, and the drawings, the description will be made under the following definition: The direction X shown in FIG. 1 is the rightward/leftward direction of an imaging apparatus and components thereof; the direction Y shown in FIG. 1 is the frontward/rearward direction of the imaging apparatus and components thereof; and the direction Z in FIG. 1 is the optical axis direction, the height direction, and the upward/downward direction of the imaging apparatus and components thereof. It is noted, however, that the definition of the directions is not intended to limit the directions in which the imaging apparatus and other components of the present invention are implemented and used.

Configuration of Imaging Apparatus 1

An imaging apparatus 1 includes a housing 8 whose front side forms an opening 81, an imaging circuit unit 4 which serves as an "imaging part" provided in the housing 8, a lens unit 3 which is attached to the opening 81 of the housing 8, a connector 5 for external connection which is provided in the housing 8 and connects the imaging circuit unit 4 to an external apparatus, and fixing members 9 which fix the imaging circuit unit 4 in the housing 8.

The housing 8 includes an outer frame member 7 and an inner frame member 6, which is formed of a box-shaped metal shell as an "enclosure section shielding body" provided in the outer frame member 7 so as to be in intimate contact therewith. The inner frame member 6 is so formed in insert molding with the inner frame member 6 inserted into the outer frame member 7, and the housing 8 is therefore formed as a molded body formed of the outer frame member 7 and the inner frame member 6 integrated with each other.

The outer frame member 7 is formed of a thermally conductive resin molded body having a thermal conductivity ranging from 1 to 20 W/mK. A box-shaped section 71, which serves as an "enclosure section," is formed in a front portion of the outer frame member 7, and a tubular section 72, which serves as a "connector section," is formed in a rear portion of the outer frame member 7.

Figure 7:
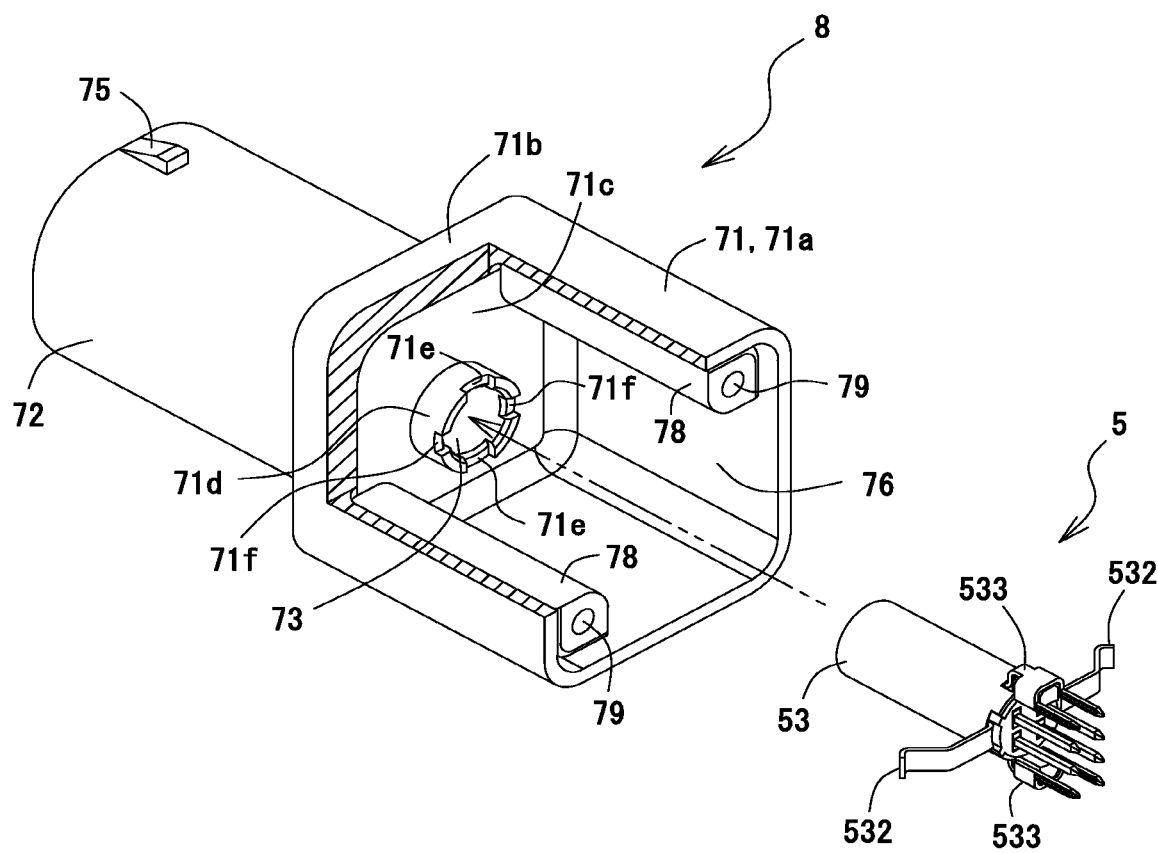
FIG. 7 is a perspective view of the housing in FIG. 1 with part thereof cut off.
Figure 8:
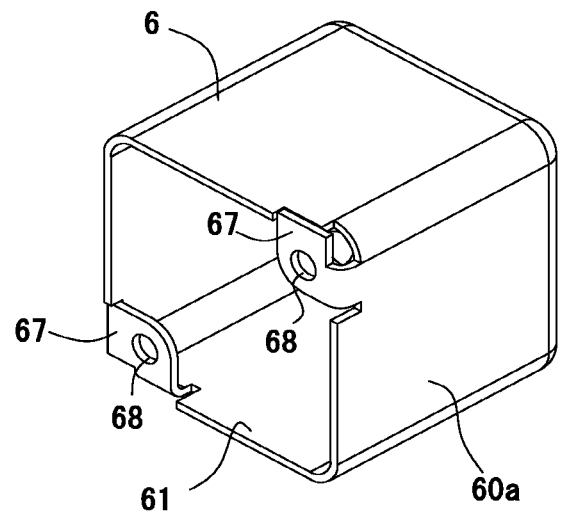
FIG. 8 is a perspective view including the front surface, the right side surface, and the plan surface of an inner frame member in FIG. 1.
Figure 9:
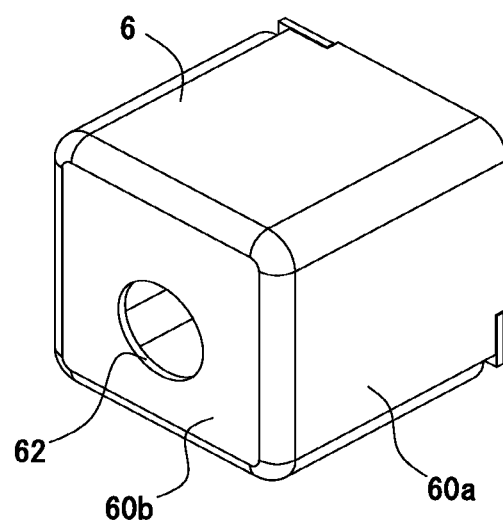
FIG. 9 is a perspective view including the rear surface, the right side surface, and the plan surface of the inner frame member in FIG. 1.
Figure 10:
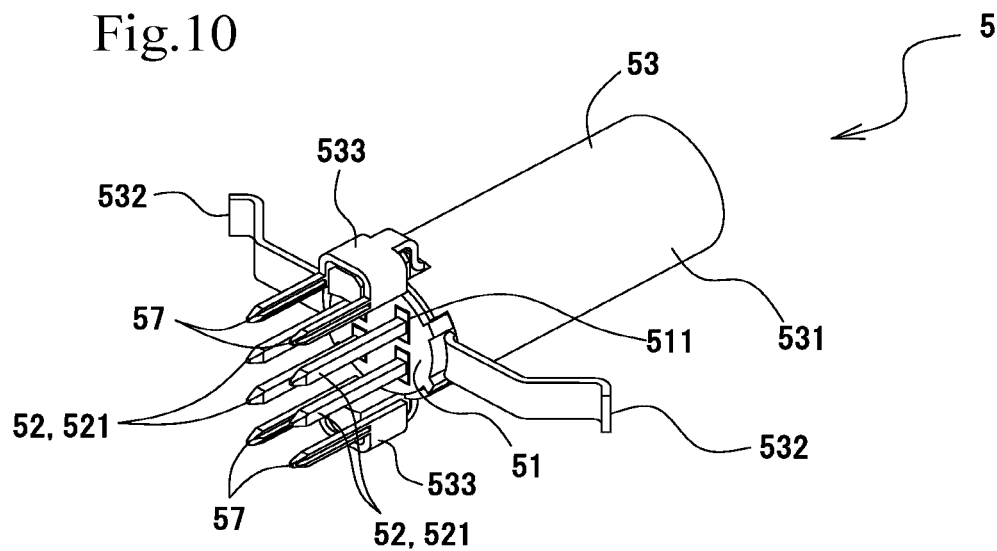
FIG. 10 is a perspective view including the front surface, the right side surface, and the plan surface of a connector for external connection in FIG. 1.
Figure 11:
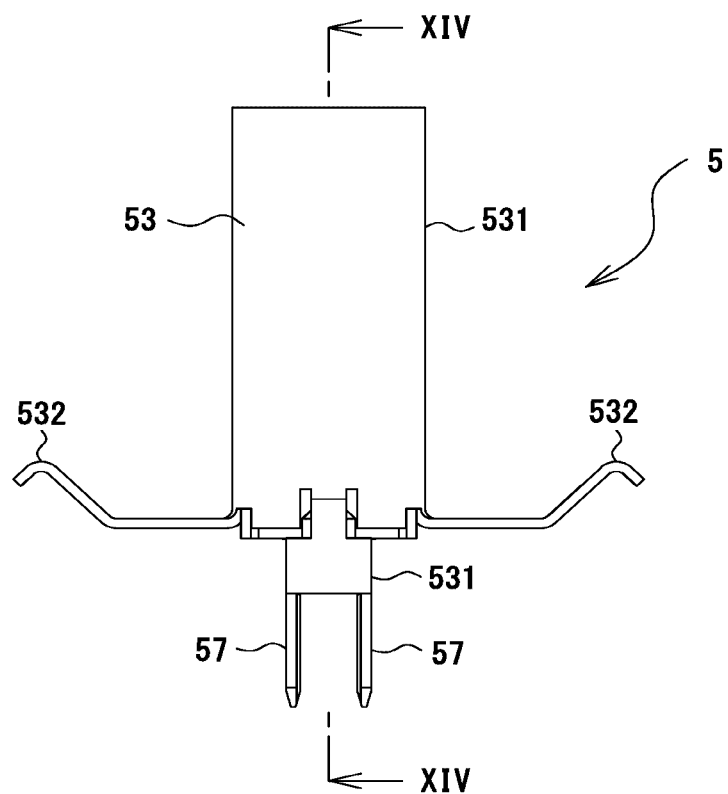
FIG. 11 is a plan view of the connector for external connection.
Figure 12:
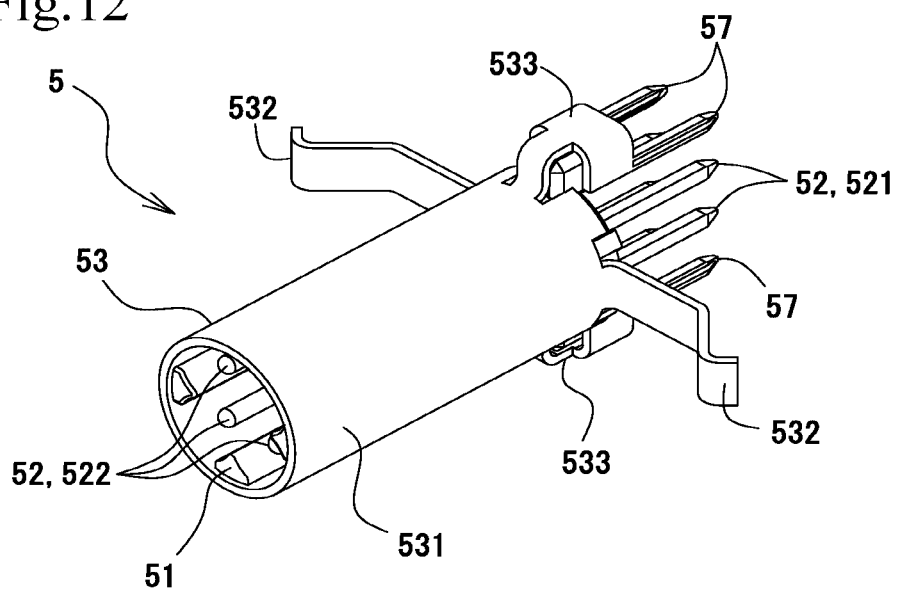
FIG. 12 is a perspective view including the rear surface, the left side surface, and the plan surface of the connector for external connection in FIG. 1.
Figure 13:
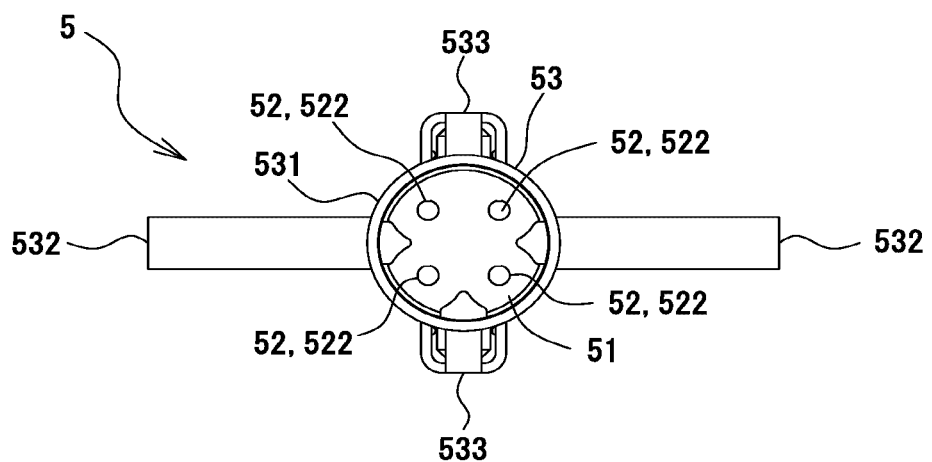
FIG. 13 is a rear view of the connector for external connection in FIG. 1.
Figure 14:
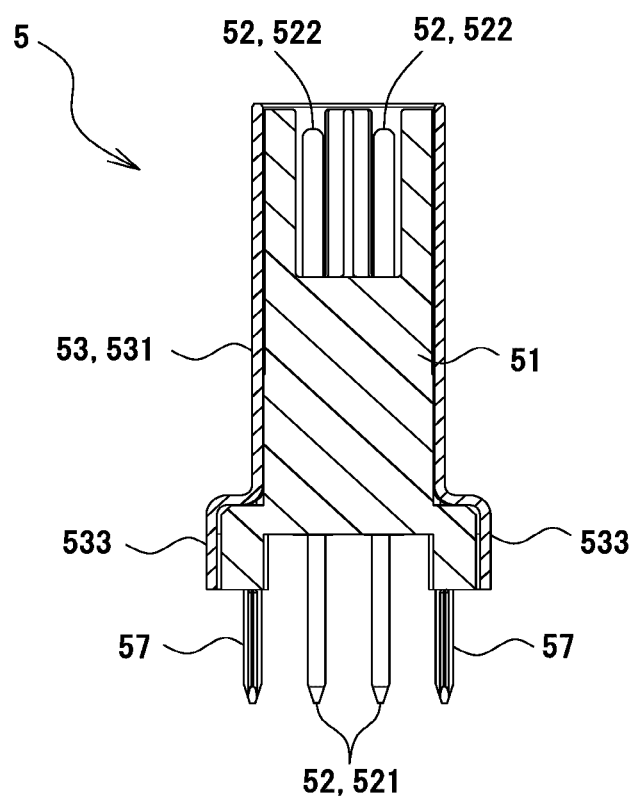
FIG. 14 is a cross-sectional view taken along the line XIV-XIV in FIG. 11.

The box-shaped section 71 has a tubular circumferential wall 71a with an opening 77 formed on the front side of the box-shaped section 71. A bottom wall 71c is formed by a barrier wall 71b on the rear side of the box-shaped section 71 of the side opposite the front side thereof, so that the box-shaped section 71 has a rectangular box-like shape as a whole. The interior of the box-shaped section 71 forms a cavity 76, which accommodates the inner frame member 6. Columnar sections 78, which extend in the direction Z, are provided at two opposing corners of the cavity 76. A threaded hole 79, which engages with a screw, is formed in each of the columnar section 78. A tubular support wall 71d, which is provided along a hole edge of a first insertion hole 73, which will be described later, is formed on the bottom wall 71c. The tubular support wall 71d is a cylindrical resin wall, and first recesses 71e and second recesses 71f are formed in the outer circumference of the tubular support wall 71d. Positioning protrusions 533, which are provided at part of a pin shield 53, which will be described later, are fit in the first recesses 71e, and contact pieces 532 enter the second recesses 71f in such a way that the contact pieces 532 are elastically deformable (see FIG. 7). The tubular support wall 71d also functions as a barrier wall that prevents the pin shield 53, which will be described later, from coming into contact with and rubbing against the inner frame member 6 when the pin shield 53 is inserted into the first insertion hole 73. If the pin shield 53 rubs against the inner frame member 6 when inserted into the first insertion hole 73, metal residues that cause a short circuit are produced, but the thus functioning tubular support wall 71d can prevent the metal residues from being produced.

The tubular section 72 is formed in a cylindrical shape, and the first insertion hole 73, which passes through the barrier wall 71b and communicates with the cavity 76 and into which the connector 5 for external connection is inserted and attached, is formed on the front side of the tubular section 72. On the other hand, a second insertion hole 74, which communicates with the first insertion hole 73 and into which a socket 21 of a relay connector 2 is insertable, is formed on the rear side of the tubular section 72. A locking claw 75, which is a protrusion for locking the relay connector 2, is formed on an outer circumferential portion of the tubular section 72.

The inner frame member 6, which serves as the "enclosure section shielding body," is formed in a bottomed tubular shape having a circumferential wall section 60a, which covers the tubular circumferential wall 71a of the box-shaped section 71, and a bottom wall section 60b, which covers the bottom wall 71c of the box-shaped section 71. The inner frame member 6 is made of a metal material that excels in thermal conductivity, such as aluminum and a copper alloy. The front side of the inner frame member 6 forms an opening 61. A cavity 63 is formed in the inner frame member 6. A third insertion hole 62, which communicates with the cavity 63 and into which the connector 5 for external connection is insertable, is formed in the bottom wall section 60b. Attachment plates 67, which each protrude in the form of an inward flange toward the interior of the cavity 63, are formed at a pair of opposing corners of the opening 61 of the inner frame member 6. An attachment hole 68, which is provided with a thread groove and engages with the fixing members 9 of screws, is formed in each of the attachment plates 67. The inner frame member 6 is so formed in insert molding with the inner frame member 6 inserted into the outer frame member 7 to form an integrated molded body. The surface of the outer frame member 7 and the surface of the inner frame member 6 that are in contact with each other are therefore in intimate contact with each other with no gap therebetween, whereby satisfactory thermal conductivity between the two members is achieved.

The imaging circuit unit 4 includes substrate 41a, 41b, and 41c, which have a variety of electric elements and circuit wiring lines, a connector 42a, which connects the substrates 41a and 41b to each other, a connector 42b, which connects the substrates 41b and 41c to each other, an imaging element 44, which is mounted on the substrate 41a, and a relay connector 48.

The substrate 41a, 41b, and 41c are each a printed circuit board. Out of the three substrates, heat dissipating metal wiring lines 43 and 47, which differ from the circuit wiring lines, are formed on a front surface and a rear surface of the substrate 41a, respectively. Through holes 45, which engage with the fixing members 9 of screws, are provided in the substrate 41a. In the present embodiment, a thread groove and a metal film that leads to the heat dissipating metal wiring line 43 are formed on the inner surface of each of the through holes 45. Cutouts 49a and 49b are formed in the substrates 41b and 41c, respectively. The cutouts 49a and 49b are so formed that the substrates 41b and 41c can be smoothly inserted into the inner frame member 6 and incorporated therein with no interference with the attachment plates 67. The relay connector 48, which achieves electrically continuous connection with the connector 5 for external connection, is provided on the substrate 41c. The relay connector 48 has the function of connecting the imaging circuit unit 4 to the external apparatus via the connector 5 for external connection. The housing of the relay connector 48 is provided with four socket terminals (not shown) corresponding to four pin terminals 52 of the connector 5 for external connection so that the socket terminals achieve electrically continuous connection with the pin terminals 52.

The imaging element 44 is an imaging device, such as a charge coupled device (CCD) and a complementary metal oxide semiconductor (CMOS) device, converts light guided through the lens unit 3 into an electric signal, and outputs the electric signal to the external apparatus.

The lens unit 3 is a member that is so fixed as to close the front-side opening 81 of the housing 8, and a lens 31, which guides light to the imaging element 44, is provided in a central portion of a plate-shaped main body section 32. The lens unit 3 can be attached to the housing 8 by means of fitting, bonding, screw fixation, or any other arbitrary method. The main body section 32 is formed of a square plate-shaped resin molded body and is a non-light-transparent member that transmits no outside light. The lens 31 is a member that is made of a resin or glass material, collects outside light, and forms an image on the front surface of the imaging element 44. It is assumed that the lens 31 is integrated with the main body section 32 in insert molding in the present embodiment. The lens 31 may instead be bonded or otherwise attached to and integrated with the main body section 32.

The connector 5 for external connection achieves electrically conductive connection between the imaging circuit unit 4 and the external apparatus. The connector 5 for external connection has a plurality of pin terminals 52 (four pin terminals 52 in present embodiment), which are connected to the relay connector 48 of the imaging circuit unit 4, a housing 51, which serves as a "terminal holder" to which the pin terminals 52 are press-fitted and fixed, and the pin shield 53, which serves as a "connector section shielding body" which is fixed to the housing 51 so as to cover the circumference of the housing 51 and the pin terminals 52.

The pin terminals 52 are inserted into the socket terminals (not shown) of the relay connector 48 of the imaging circuit unit 4 to achieve electrically conductive connection therewith. The pin terminals 52 not only transmit an electric signal produced by the imaging circuit unit 4 but is used to supply electric power from the external apparatus to the imaging circuit unit 4. The housing 51 is a circular columnar resin molded body having terminal holding holes 511, to which the pin terminals 52 are press-fitted and fixed. The pin terminals 52 are press-fitted and fixed into the terminal holding holes 511, and internal connection pins 521, which serve as "internal contact sections" of the pin terminals 52, protrude via the front end of the housing 51. Further, external connection pins 522, which serve as "external contact sections" of the pin terminals 52, protrude via the rear end of the housing 51. The external connection pins 522 are covered with the cylindrical pin shield 53 and disposed in the internal space thereof. When the socket 21 of the relay connector 2 is inserted into the second insertion hole 74, a connection terminal 22 in the socket 21 is inserted into the pin shield 53, and the connection terminal 22 achieves electrically conductive connection with the external connection pins 522 in the pin shield 53. The fixation of the pin terminals 52 to the housing 51 does not necessarily based on press fitting and may instead be based on insert molding.

The pin shield 53 is a cylindrical metal molded body that electromagnetically shields the pin terminals 52 and includes a tubular main body 531 and the paired contact pieces 532, which are located at the front end of the tubular main body 531 and extend in the radial direction (+Y direction, −Y direction) with respect to the axis of the tubular pin shield 53. The contact pieces 532 are each formed as a spring piece that extends in the form of a cantilever from the tubular main body 531. The contact pieces 532, which are elastically deformed, can therefore achieve pressing contact with the bottom wall section 60b of the inner frame member 6. The contact pieces 532, which are elastically deformed to achieve the pressing contact, can reliably maintain the pressing contact with the inner frame member 6 even if the components of the imaging apparatus 1 are each positionally shifted by a small amount when the imaging apparatus 1 is assembled or due to impact or vibration acting on the imaging apparatus 1 in use.

The pin shield 53 is further provided with four pins 57 for ground connection, which protrude frontward.

The pin shield 53 has positioning protrusions 533 as a locking section, which protrude outward. The positioning protrusions 533 are fit into the first recesses 71e of the tubular support wall 71d, which is formed on the bottom wall 71c of the box-shaped section 71, as described above. The pin shield 53 will therefore not rotate even if external force that rotates the pin shield 53 in the first insertion hole 73 acts on the pin shield 53 because the positioning protrusions 533 abut against the first recesses 71e, whereby the pin shield 53 will not loosen or fall off and can maintain the correct attachment state.

The fixing members 9 are screws made of a metal. The threaded portion formed on a shaft portion of each of the fixing members 9 engages with the thread groove of the corresponding through hole 45 provided in the substrate 41a and further engages with the thread groove of the corresponding attachment hole 68 provided in the inner frame member 6, whereby the imaging circuit unit 4 can be fixed to the housing 8.

In the state in which the imaging circuit unit 4 is fixed to the housing 8 with the fixing members 9, a head portion of each of the fixing members 9, which are screws, comes into contact with the heat dissipating metal wiring line 43, which is located on the side where the imaging element 44 of the substrate 41a is mounted, and the shaft of each of the screws abuts against the metal film formed on the inner surface of the corresponding through hole 45 of the substrate 41a. The metal film leads to the heat dissipating metal wiring line 47, which is formed on a surface of the substrate 41a that is the surface opposite the surface on which the imaging element 44 is mounted. The heat dissipating metal wiring line 47 is in contact with the attachment plates 67 of the inner frame member 6. Further, the inner frame member 6 is in contact with the pin shield 53 via the contact pieces 532. A thermally conductive path along which metal materials that excel in thermal conductivity are linked to each other is thus formed, that is, the thermally conductive path starts from the imaging element 44, includes the heat dissipating metal wiring line 43, the fixing members 9, the metal films in the through holes 45, the heat dissipating metal wiring line 47, and reaches the inner frame member 6 and the pin shield 53. The heat of the imaging element 44 can thus be effectively dissipated by using the components of the imaging apparatus 1.

The imaging apparatus 1 described above is connected to the external apparatus via the relay connector 2. The relay connector 2 is a connector that connects the imaging apparatus 1 to the external apparatus and includes the socket 21, the connection terminal 22 which is provided in the socket 21, a locking claw 23 which is provided as part of the socket 21, a cable 24 which extends rearward from the socket 21, and a cable shield 25 made of a metal.

Figure 3:
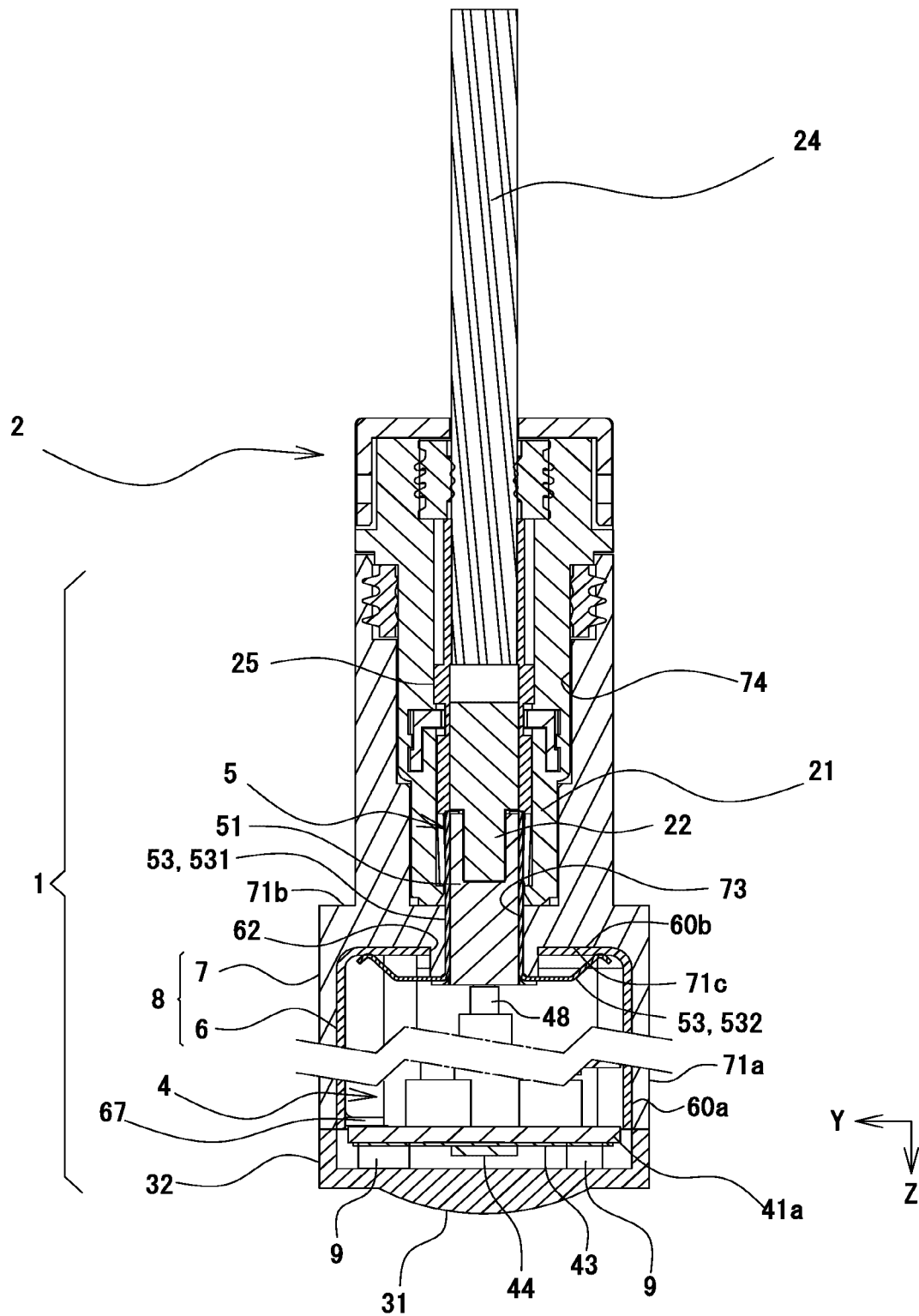
FIG. 3 is a central longitudinal section of the imaging apparatus in Fi. 1 taken along the plane X-Z.
Figure 4:
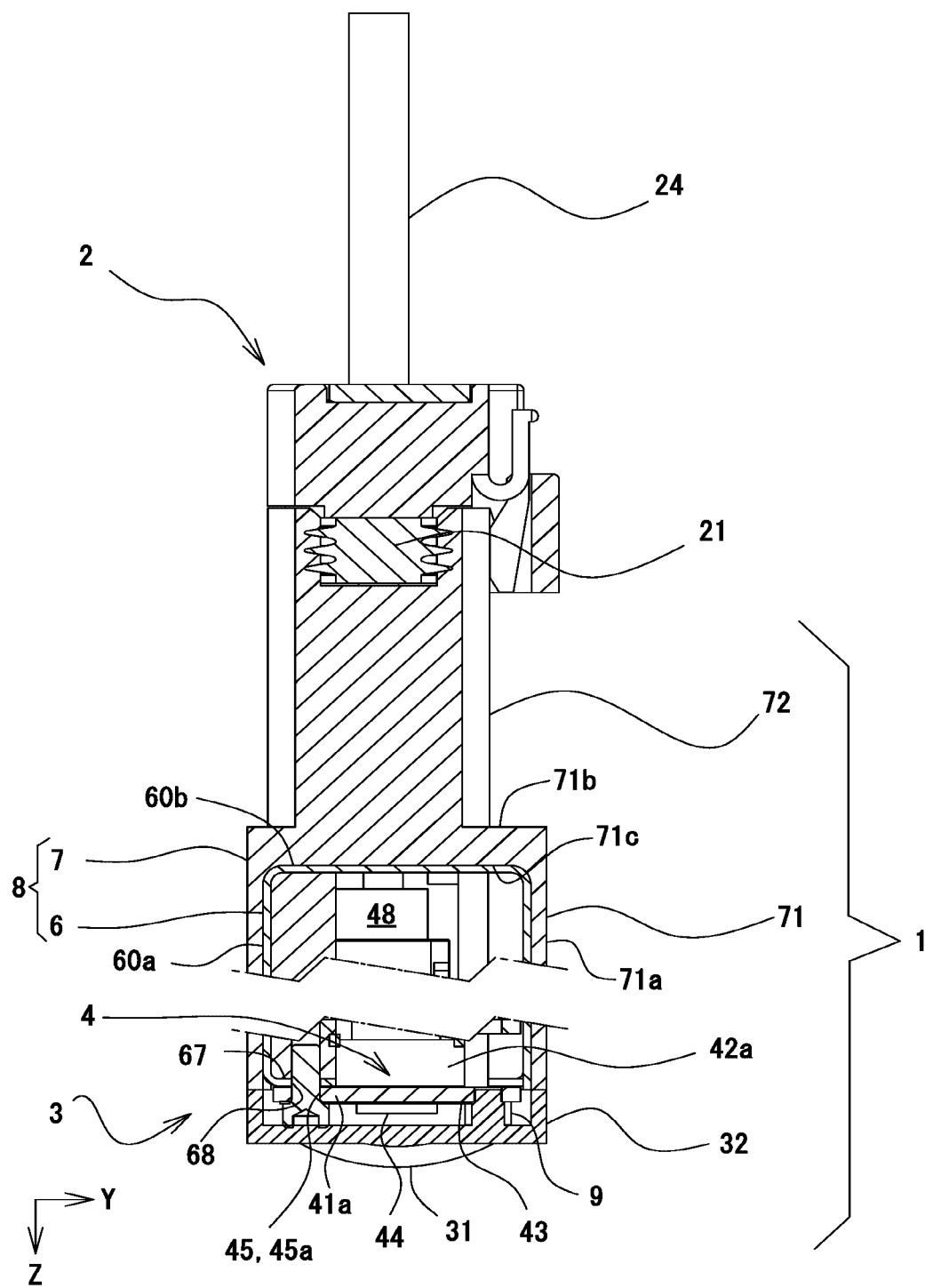
FIG. 4 is a longitudinal section of the imaging apparatus in FIG. 1 taken along the plane Y-Z and containing the axis of a fixing member.
Figure 5:
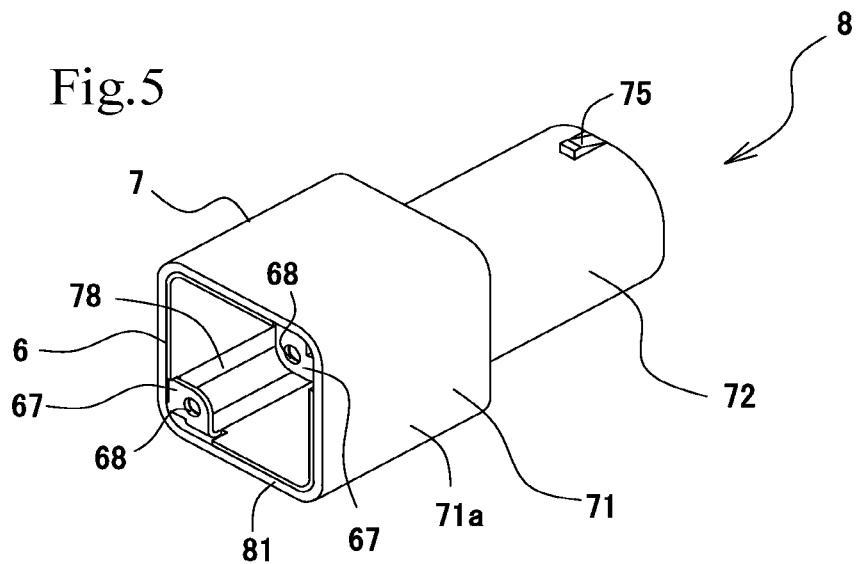
FIG. 5 is a perspective view including the front surface, the right side surface, and the plan surface of a housing in FIG. 1.
Figure 6:
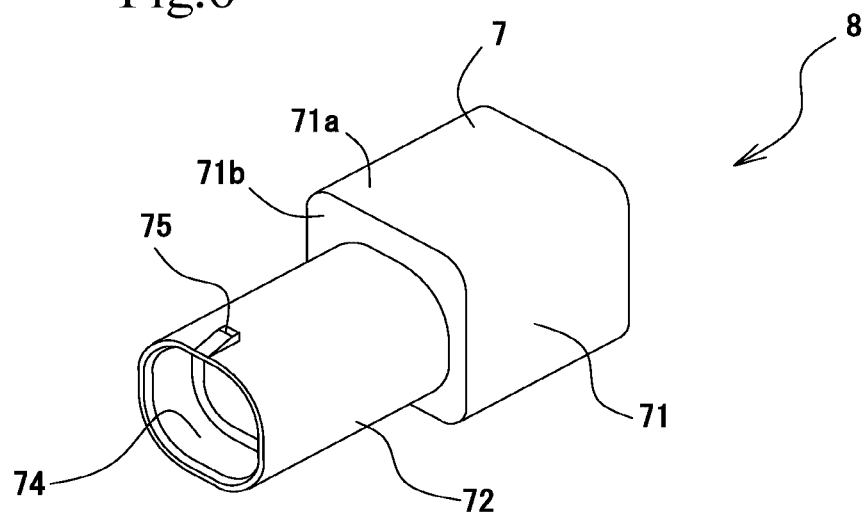
FIG. 6 is a perspective view including the rear surface, the left side surface, and the plan surface of the housing in FIG. 1.

The socket 21 is formed of a tubular resin molded body and has an outer shape that can be inserted into the second insertion hole 74, which is formed in the tubular section 72 of the housing 8. The connection terminal 22 achieves electrically continuous connection with the pin terminals 52 of the connector 5 for external connection of the imaging apparatus 1. The locking claw 23 engages with the locking claw 75, which is formed on the outer circumferential portion of the tubular section 72, so that the relay connector 2 does not fall off the interior of the tubular section 72. The cable 24 is a coaxial cable that transmits the electric signal produced by the imaging circuit unit 4 to the external apparatus, and lead wires which correspond to the number of pin terminals 52 are contained in the cable 24. Sockets, terminals, and other components for connection with the external apparatus are provided at an end of the relay connector 2 that is the end opposite the imaging apparatus 1. The cable shield 25 electromagnetically shields the portion from a base end portion of the connection terminal 22, which is inserted into the tubular main body 531 of the pin shield 53, to a front-end-side portion of the cable 24 (FIG. 3) and is formed of a cylindrical metal member. When the relay connector 2 is connected to the imaging apparatus 1, the front end of the cable shield 25 abuts against the front end of the pin shield 53 so that the front ends are in contact with each other. The connection described above between the relay connector 2 and the imaging apparatus 1 allows transmission of an electric signal produced by the imaging apparatus 1 to the external apparatus.

Advantageous Effects of Imaging Apparatus 1

Advantageous effects of the imaging apparatus 1 according to the present embodiment will be described except those having been described.

The imaging apparatus 1 has the thermally conductive path in which the heat generated by the imaging element 44 is transferred via the heat dissipating metal wiring line 43, the fixing members 9, the metal films in the through holes 45, and the heat dissipating metal wiring line 47 to the inner frame member 6, and then to the outer frame member 7. The heat dissipating metal wiring line 43, the fixing members 9, the metal films in the through holes 45, the heat dissipating metal wiring line 47, and the inner frame member 6 are each made of a metal material and therefore have satisfactory thermal conductivity. The outer frame member 7 is also made of a thermally conductive resin and therefore has satisfactory thermal conductivity. That is, the thermally conductive path from the imaging element 44 to the outer frame member 7 has satisfactory thermal conductivity and can transfer the heat generated by the imaging element 44 to the outer frame member 7 and dissipate the heat via the outer frame member 7 to the atmosphere. The heat in the imaging circuit unit 4 can therefore be effectively dissipated.

The heat transferred to the inner frame member 6 is also transferred to the pin shield 53, which is made of a metal and is in contact with the inner frame member 6 via the contact pieces 532, and the heat is also transferred out of the box-shaped section 71 of the housing 8 via the pin shield 53 to the tubular section 72. The heat is therefore not accumulated in the box-shaped section 71 of the housing 8 but can be dissipated. Further, the heat transferred to the pin shield 53 is also transferred to the cable shield 25 because the front end of the pin shield 53 abuts against the front end of the cable shield 25, which is made of a metal, of the relay connector 2. The heat transferred to the inner frame member 6 can therefore be transferred also to the components of the relay connector 2 via the cable shield 25 and dissipated from the relay connector 2.

The imaging circuit unit 4 is covered with the circumferential wall section 60a and the bottom wall section 60b of the inner frame member 6 made of a metal. Therefore, the imaging circuit unit 4 is shielded against external electromagnetic waves and can effectively prevent generation of noise resulting from the electromagnetic waves. Further, the pin terminals 52 of the connector 5 for external connection are so configured that portions thereof fixed by the terminal holding holes 511 and the external connection pins 522 are covered with the tubular main body 531 of the pin shield 53. The portion that achieves electrically continuous connection with the relay connector 2, which leads to the external apparatus, can also be reliably shielded against electromagnetic waves.

Further, the inner frame member 6 and the pin shield 53 are formed separately from each other and are ideally preferably formed as an integrated member from the viewpoint of the electromagnetic shielding. The tubular main body 531 of the pin shield 53, however, passes through the bottom wall section 60b of the inner frame member 6 with an end portion of the tubular main body 531 located in the inner frame member 6, and the tubular main body 531 therefore overlaps with the inner frame member 6, so that no gap is present therebetween in the Z direction. The inner frame member 6 and the pin shield 53, which are separate members, can therefore reliably provide electromagnetic shielding.

Providing the connector for external connection in the connector section shielding body allows the connector for external connection to be handled as a component of the connector section shielding body, that is, a part thereof, whereby the integrated unit can be readily handled in the steps of manufacturing the imaging apparatus.

Variations of Embodiment

The present invention is not limited to the embodiment described above and can be implemented in a variety of variations. Examples of the variations will be described.

The embodiment described above shows the case where the thermally conductive path is formed in such a way that the fixing members 9 are screws, the head portion of each of the screws is in contact with the heat dissipating metal wiring line 43 on the surface on which the imaging element 44 is mounted, the shaft of each of the screws is in contact with the metal film in the corresponding through hole 45 and with the inner frame member 6, and the heat dissipating metal wiring line 47, which is continuous with the metal films in the through holes 45, is in contact with the inner frame member 6. The thermally conductive path may instead be formed in such a way that the fixing members 9 are each a bolt and a nut, the head portion of each of the bolts is in contact with the heat dissipating metal wiring line 43, and the nuts are in contact with the inner frame member 6 so that the heat dissipating metal wiring line 43 is connected to the inner frame member 6 via the fixing members 9. The thus formed fixing members 9 can similarly form the thermally conductive path from the imaging element 44 to the inner frame member 6.

The fixing members 9 may instead be a thermally conductive adhesive. In this case, the thermally conductive adhesive is continuously applied to the portion from the heat dissipating metal wiring line 43 via the through holes 45 to the heat dissipating metal wiring line 47 and the inner frame member 6, whereby a thermally conductive path ranging from the heat dissipating metal wiring line 43 to the inner frame member 6 can be formed.

In the embodiment described above, the case where the contact pieces 532 are each a spring piece has been presented. The contact pieces 532 are not each necessarily a spring piece and can instead each be a plate piece that is in contact with the inner frame member 6. The contact piece in the variation cannot, of course, provide the advantageous effect provided by the contact pieces 532 each formed of a spring piece.

In the embodiment described above, the case where the imaging circuit unit 4 includes the three substrate 41a, 41b, and 41c has been presented, but the number of substrates is not limited to three. Further, the connectors 42a and 42b are used to achieve inter-substrate electrically continuous connection but are only an example that achieves the inter-substrate electrically continuous connection, and other means may be used to achieve the inter-substrate electrically continuous connection. The configuration of the imaging circuit unit 4 is not limited to that shown in the present embodiment by way of example, and the imaging circuit unit may instead be formed of a single substrate, the imaging element 44 and the heat dissipating metal wiring line 43 mounted on the substrate, through holes formed in the substrate and used to fix the imaging circuit unit with the aid of the fixing members 9, and the relay connector 48 disposed on the rear surface of the substrate. The number of substrates to be used may, of course, be any number, such as two and four.

REFERENCE SIGNS LIST

1: Imaging apparatus
2: Relay connector
21: Socket
22: Connection terminal
23: Locking claw
24: Cable
25: Cable shield
3: Lens unit
31: Lens
32: Main body section
4: Imaging circuit unit
41a, 41b, 41c: Substrate
42a, 42b: Connector
43: Heat dissipating metal wiring line
44: Imaging element
45: Through hole
47: Heat dissipating metal wiring line
48: Relay connector
49a, 49b: Cutout
5: Connector for external connection
51: Housing (terminal holder)
511: Terminal holding hole
52: Pin terminal (connector terminal)
521: Internal connection pin (internal contact section)
522: External connection pin (external contact section)
53: Pin shield (connector section shielding body)
531: Tubular main body
532: Contact piece
533: Positioning protrusion
57: Pin for ground connection
6: Inner frame member (enclosure section shielding body)
60a: Circumferential wall section
60b: Bottom wall section
61: Opening
62: Third insertion hole
63: Cavity
67: Attachment plate
68: Attachment hole
7: Outer frame member (enclosure section)
71: Box-shaped section (enclosure section)
71a: Tubular circumferential wall
71b: Barrier wall
71c: Bottom wall
71d: Tubular support wall
71e: First recess
71f: Second recess
72: Tubular section (connector section)
73: First insertion hole
74: Second insertion hole
75: Locking claw
76: Cavity
77: Opening
78: Columnar section
79: Threaded hole
8: Housing
81: Opening
9: Fixing member

The invention claimed is:

1. Parts for an imaging apparatus comprising:
an outer frame member made of a resin;
an inner frame member made of a metal material having a bottom wall section to shield an imaging part;
a connector contacting the inner frame member,
wherein the outer frame member has a barrier wall between a relay connector and the inner frame member, and the barrier wall has a first insertion hole,
wherein the connector has
a connector section shielding body in a cylindrical shape and made of metal, and a connector terminal including
an internal contact section located at a first end of the connector and connectable to the imaging part and
an external contact section located at a second end of the connector opposite from the first end,
wherein the connector section shielding body and the inner frame member are fixed to the outer frame member independent from each other,
wherein an inner surface of the first insertion hole is fitted with a peripheral surface of the connector section shielding body.

2. The parts for an imaging apparatus according to claim 1, the inner surface is entirely fitted with the peripheral surface of the connector configured to seal the first insertion hole.

3. The parts for an imaging apparatus according to claim 1, wherein the barrier wall is located between the internal contact section and the external contact section.

4. The parts for an imaging apparatus according to claim 1, wherein the connector section shielding body includes a contact piece
that is a single metal piece with the connector section shielding body,
that extends from an edge of the connector section shielding body outwardly and contacts to a surface of the bottom wall section, the surface being facing the imaging part, and
that achieves electrically continuous connection with the inner frame member.

5. The parts for an imaging apparatus according to claim 4, wherein the contact piece is a spring piece that achieves pressing contact with the inner frame member.

6. The parts for an imaging apparatus according to claim 1,
wherein the inner frame member includes
a circumferential wall section disposed on an inner circumferential surface of a tubular circumferential wall that forms an enclosure section, and
a bottom wall section disposed on a wall surface that forms the barrier wall and faces the enclosure section.

7. The parts for an imaging apparatus according to claim 1, wherein the connector section shielding body includes a tubular main body that passes through the barrier wall from an interior of the connector and protrudes into an interior of the inner frame member.

8. The parts for an imaging apparatus according to claim 1, wherein the connector section shielding body accommodates the connector terminal and a terminal holder that is made of a resin material and holds the connector terminal.

9. The parts for an imaging apparatus according to claim 1, wherein the connector section shielding body include a locking section that protrudes from an outer surface of the connector section shielding body and is locked by the outer frame member.

10. The parts for an imaging apparatus according to claim 1,
wherein one end of the connector section shielding body contacts one end of a metal shield located inside the relay connector so as to be conductive with the metal shield.

11. An imaging apparatus, comprising:
a relay connector;
parts for the imaging apparatus according to claim 1, the parts being connected to the relay connector.

12. The parts for an imaging apparatus according to claim 1, wherein the connector section shielding body includes a contact piece
that is a single metal piece with the connector section shielding body,
that extends from the connector section shielding body outwardly, and contacts to the inner frame member on the one side over the bottom wall, and
that achieves electrically continuous connection with the inner frame member.

* * * * *